United States Patent [19]

Firstein et al.

[11] Patent Number: 5,585,211
[45] Date of Patent: Dec. 17, 1996

[54] FABRICATION AND USE OF SUB-MICRON DIMENSIONAL STANDARD

[76] Inventors: Leon A. Firstein, 6151 Orange St., Los Angeles, Calif. 90048; John L. Rogers, 23-28 Gloucester Street, Christchurch 8001, New Zealand; Arthur Noz, 7678 El Capitan, Buena Park, Calif. 90620

[21] Appl. No.: 383,922

[22] Filed: Feb. 6, 1995

[51] Int. Cl.$^6$ .................................................. G03C 5/00
[52] U.S. Cl. .......................... 430/30; 430/296; 430/942; 250/492.3
[58] Field of Search ........................... 430/30, 296, 942; 437/8; 250/492.3

[56] References Cited

U.S. PATENT DOCUMENTS

| | | | |
|---|---|---|---|
| 3,961,102 | 6/1976 | Ballantyne et al. | 430/296 |
| 5,087,537 | 2/1992 | Conway et al. | 430/15 |

*Primary Examiner*—John A. McPherson
*Attorney, Agent, or Firm*—Burns, Doane, Swecker & Mathis, L.L.P.

[57] ABSTRACT

A sub-micron dimensional standard is embodied in a grating of equal-sized lines and spaces formed in an electron-sensitive material by means of E-beam lithography. Several gratings are generated in the material at different respective doses of electrons. For each dose, a plurality of gratings are formed with different respective energy deposition contours over the interface of a line and a space. At one dose the energy deposition contour will be the same for all of the different energy deposition contour values. The grating formed with this dose is chosen as the one having a part which forms the standard. The width of a line, as well as the width of a space, in the selected grating is known in absolute terms to the same degree of accuracy as the grating's period. With such an artifact, the systematic error inherent to a measurement system can be determined. Once this error is known, it can be employed as a compensating factor to correct measurements made via the system.

21 Claims, 11 Drawing Sheets

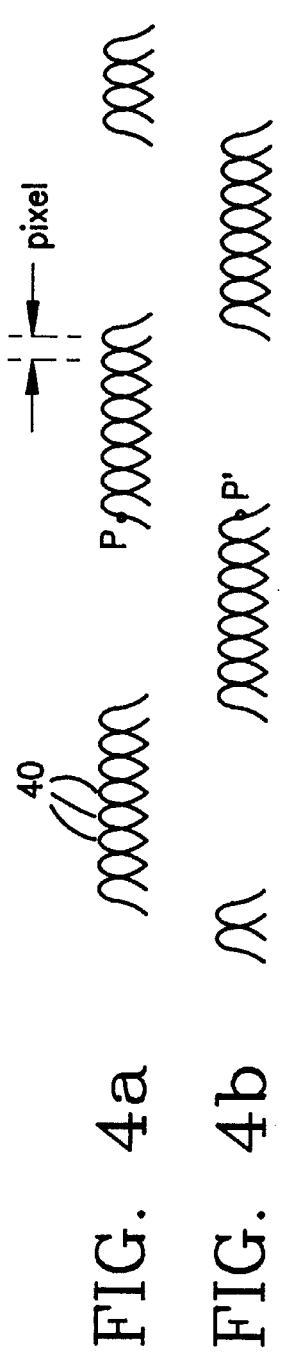
FIG. 4a
FIG. 4b
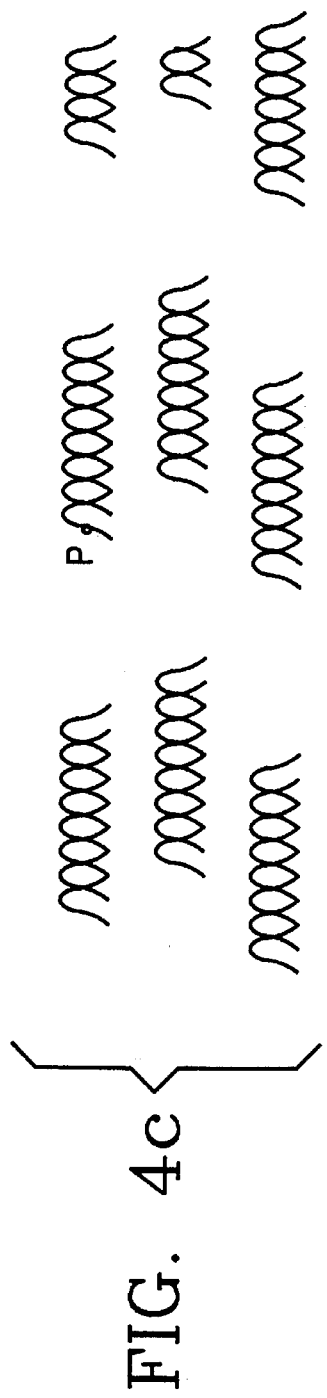
FIG. 4c
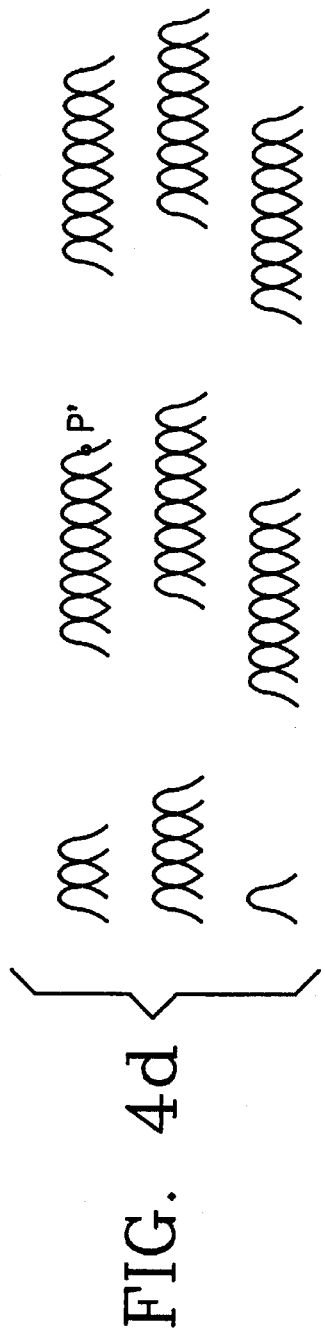
FIG. 4d

FABRICATION AND USE OF SUB-MICRON DIMENSIONAL STANDARD

BACKGROUND OF THE INVENTION

The present invention is directed to the measurement of small dimensions on the order of microns and below, and more particularly to methods for the fabrication and use of a standard having a dimension that deviates from a predetermined absolute value by a known amount.

Historically, technological progress has been intricately intertwined with the ability to accurately measure the lengths of objects and the times, or duration, of events. The more accurate (in absolute terms) the measurements of diminishing lengths and decreasing time have become, the more sophisticated areas of knowledge that have become accessible to advance technological progress.

The invention of the scanning electron microscope (SEM) has played a role in this advance because the SEM has provided an ability to "see", and sometimes to "see very well", objects which previously, even in the most sophisticated optical microscope, were either partially or completely unresolved. The SEM has enabled the extension of the limits of optical imaging (about several microns) down to well below 0.05 micron.

Technically, the invention of the SEM is founded on an innovative approach to imaging that uses a stream of energetic electrons rather than a stream of photons. Since the wavelength of electrons is much, much smaller than that of photons, the resolution, i.e. the ability to "see the object clearly", is dramatically improved. Indeed, a sub-micron feature is clearly imaged on an SEM's monitor by a 2-dimensional or 3-dimensional brightness-delineated contour.

The scanning electron microscope has, therefore, become an indispensable tool as a visual and measuring aid where small dimensions are critical, such as in the manufacture of micro-electronic devices, especially now that dimensional miniaturization has progressed into the micron and sub-micron domain.

The SEM also was a prototype of present day E-beam lithographic equipment. The extension to this application came from a realization that energetic electrons can be used, in addition to image generation, to "carve out" a desired pattern in electron-sensitive material, in which the presence or absence of exposure by electrons can be reproduced by subsequent development, as is done in optical lithography. With the availability of high-contrast and high-electron-sensitive organic materials, so-called resists, E-beam lithography has rapidly advanced into the micron and sub-micron domain.

However, the application of E-beam lithography to high-density patterns has enforced a realization that the fidelity of an E-beam exposed pattern to the designed one is governed not solely by the accuracy of beam positioning, but also by the intricate details of electron scattering which take place in the resist and in the supporting substrate during exposure. As insights into the pattern formation mechanism have been gained, it has been learned that two major components contribute to energy deposited at, or near, the pattern's edges and in this way define pattern fidelity. These two components are short-range low angle scattering (about 0.1 µm or less), so called forward scattering, and long-range wide angle scattering (over several microns), so called back scattering.

Somewhat ironically, the influence of the back-scattering phenomenon on image formation in the SEM was acknowledged much later, when it was realized that edge-brightness loses its sharpness by broadening due to scattering electrons, when the scattering range of these electrons is comparable to the dimensions of features in the pattern.

Even more ironically, the same phenomenon of electron-scattering that generates the image infidelity for the actual pattern being imaged in the SEM, is also responsible for infidelity of the actual pattern to the designed one during E-beam exposure. The latter infidelity is not possible to assess because image infidelity in the SEM, even at the 1µm level, is an unknown. Thus the problem to be addressed is one of how to access the magnitude of distortion that inherently affects the image infidelity in the SEM, in absolute terms.

Current E-beam lithographic equipment is recognized for its ability to produce a grating with the absolute accuracy of its periodicity not deviating more than several thousandths of a micron from the designed value. A grating, in the lithographic sense, is generated in a resist material by a periodic succession of exposed and un-exposed regions, so that after development, lines with intervening spaces are formed. The grating's period value, or pitch, is the distance between equivalent edges of neighboring lines or neighboring spaces. It is possible to achieve a highly accurate grating periodicity through accurate beam placement, as controlled by a high-precision laser-based interferometer incorporated into an E-beam writer, due to the symmetrical nature of electron-scattering-induced distortions. For the equivalent edges that determine pitch, these distortions are canceled, both during the E-beam patterning and during the SEM imaging. However, for the edges constituting a non-periodic element in a grating, i.e. a line or a space between lines, the distortions, by symmetry arguments, are doubled.

The presence of distortion generated by the interaction of energetic electrons with the material, under certain conditions, imposes limitations on the fidelity of the pattern that is written by the electron-beam lithographic technique and degrades the image fidelity of an object viewed in the SEM. The onset of these infidelities is empirically known to be operative when the size of the pattern's element and/or the dimensional proximity of those elements to each other become comparable with the range of the two major components in the electron-scattering phenomenon. These ranges, in turn, are known to be dependent on incident electron energy and the properties of the material in which the pattern is formed. While the range of each electron-scattering component is known on a quasi-quantitative level, the magnitude of electron-scattering-induced distortions generated during E-beam patterning and SEM imaging is known only on a qualitative level. As a result, a designed pattern's dimensions are fabricated larger than they should be, and the actual dimensions of the pattern are imaged in the SEM smaller than they actually are. Moreover, in SEM imaging, even in the absence of charging (an additional contributor to image infidelity), the magnitude of distortion is affected by the instability of the day-today performance of an SEM.

There are, in principle, only two ways to account for the magnitude of these distortions operative in SEM imaging. One way is to develop a theory that assuredly allows one to calculate the distortion's magnitude for a given material, at a given SEM setting and for a given pattern's dimension. The second way is to fabricate an artifact whose width is a priori pre-determined in absolute terms, as is the periodicity of a high-quality grating, and whose sensitivity to the operative distortions is not lost, as happens with the grating's period. With the aid of such an artifact, the magnitude of a distortion operative in the SEM imaging of this artifact can be determined experimentally as the difference between the known width and the width as measured in the SEM.

From the microelectronics manufacturing point of view, it appears that the most benefit can be derived from a dimensional standard of a resist feature supported by an appropriate substrate. In such a case, a scientifically-sound control of lithography, the most crucial step in device fabrication, can be achieved.

BRIEF STATEMENT OF THE INVENTION

In accordance with the present invention, such an artifact is embodied within a grating of equal-sized lines and spaces that is formed in an electron-sensitive material, e.g. a resist material, by means of E-beam lithography. The standard itself comprises a part, e.g. a line or a space, that is present in the mid-portion of such a grating. Each line in the grating has a parallelpiped shape with edges that are perpendicular, or nearly perpendicular, to the surface of the substrate. At least in the mid-portion of the grating, an edge that simultaneously delineates a line and a space is positioned at the half-period point of the grating. Because of this the width of the line, as fabricated, is equal to the width of the space, and both are made equal to the half-value of the grating's period, which is predetermined at will. The distance between the first and last line in the grating, as well as the length of each line, is selected to be much larger than the electron back-scattering in the chosen substrate.

To fabricate such a standard, the resist material is exposed to at least two different grating patterns. Each pattern is exposed over a range of incremental dose values. Upon development of the exposed material, the resulting gratings exhibit different respective linewidths as a function of incident dose. At one dose value, however, the linewidth will be independent of the different exposure patterns, i.e. it is the same for all of the different gratings formed at that dose value. A grating formed with this dose is chosen as the one having a part which forms the standard.

In the preferred embodiment of the invention, the generation of gratings with different respective linewidths versus dose slopes is accomplished with multiple shifted exposure patterns. Each pattern consists of multiple identical subgrating patterns, and the resist material is exposed once for each subgrating pattern. For a given grating, the locations of the subgrating patterns are shifted relative to one another in a direction perpendicular to the line-space interface, by an arbitrarily chosen amount. This shifting affects the slope of energy deposition over the line-space interface in the grating. Different amounts of shift are employed for different respective grating patterns, and for one pattern the amount of shift can be zero.

The significance of an artifact that is fabricated in this manner is that the width of a line, as well as the width of a space, in the selected grating whose linewidth is independent of shift value is known in absolute terms to the same degree of accuracy as the grating's period, the latter being known to be fabricated with the absolute accuracy of several thousandths of a micron by means of E-beam lithography. Using such an artifact, it is possible to determine the systematic error inherent to a measurement system. Once this error is known, it can be employed as a compensating factor to correct measurements made via the system.

As fabricated and appropriately certified, a primary standard is made out of a resist material supported on an arbitrarily chosen substrate. From this primary standard, a secondary standard can be made of any electroplatable material using an extended version of the technique described above.

The features of the invention, as well as the advantages offered thereby, are described in detail hereinafter with reference to specific examples illustrated in the accompanying drawings.

BRIEF DESCRIPTION OF THE DRAWINGS

FIGS. 4a–4d are illustrations of energy gaussians representing beam steps for lines in a grating having lines and spaces of equal width;

Detailed Description

To facilitate an understanding of the present invention and its application in the field of metrology, an explanation will first be given of the theory which underlies the principles of the invention, followed by examples of the practical implementation of that theory.

Theory

Generally speaking, the present invention is directed to the fabrication of a linewidth standard, i.e. an artifact whose width is known within a predetermined level of accuracy, which enables the inherent error of a measurement system to be precisely determined. In the preferred embodiment of the invention, this standard comprises a part in a grating whose central lines and spaces each have a width equal to one-half of the grating's periodicity. In other words, the edges of the lines are located at the half-period points of the grating.

According to the science of metrology, a claim that an artifact is a dimensional standard, i.e. its features have dimensions of known absolute value, can only be substantiated if a certification criterion, external or internal to the process for fabricating such a standard, can validate the end product. The most straightforward experimental criterion is an absolute linewidth measurement external to the fabrication process, that proves (or disproves) the attainment of the desired result. Since this type of measurement is not available, the need for certification criteria has to be fulfilled by a theory that is necessarily internal to the fabrication process.

The formulation of an appropriate criterion is based on an understanding of the intricate details of electron scattering in an electron-sensitive resist material. The interconnection of three insights forms the crux of the theoretical approach discussed hereinafter. These are a) the special symmetry requirement imposed at the half-pitch point on the value of the energy deposition contour generated over the line-space boundary by forward scattering; b) the causal relationship between the actual edge placement and the value of effective forward scattering spread in the resist; and c) a practical means to effect the variation of the effective forward scattering spread in order to vary the values of an energy deposition contour except at the half-pitch point. These specific features, coupled with the widely accepted theoretical concepts relevant to the pattern formation mechanism in E-beam-lithography generated gratings, provide the rationale for the deductive chain of conclusions that lead to the establishment of the sought-after criterion.

The starting point for this approach is the analysis of the analytical shape of the energy deposition contour that models the energy deposition in a grating generated by means of E-beam lithography. As preparation for this analysis, the practical aspects of E-beam lithography, and the mathematical representation of the factors involved, will be discussed.

Figure 1:
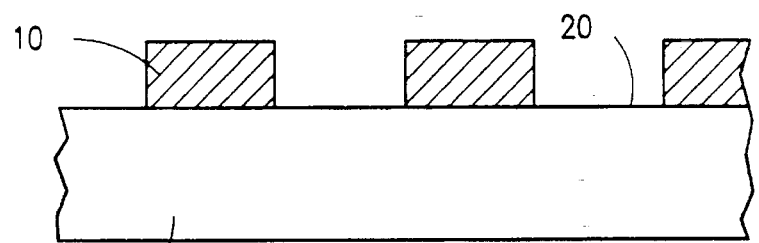
FIG. 1 is an enlarged, cross-sectional side view of an exemplary grating.

FIG. 1 is a cross sectional view of an exemplary grating of the type that can embody a dimensional standard according to the principles of the present invention. The grating consists of a pattern of lines 10 and spaces 20 formed in a suitable electron-sensitive material, such as a so-called resist material. This resist material can be supported on any arbitrary substrate 30, such as a silicon wafer. As is well-known, this pattern can be created by depositing the resist material on the substrate, selectively exposing the resist material with an electron beam, in accordance with the desired pattern, and then developing the resist material. When a negative type of resist material is used, the development step causes the unexposed portions to be removed, to form the spaces 20. The remaining, exposed portions of the resist constitute the lines 10. Alternatively, if a positive resist material is employed, the exposed portions are removed and the unexposed portions remain to form the lines.

In practice, an E-beam exposed grating is generated in the resist material by a periodic succession of exposed and un-exposed regions so that, after development, the lines and the absence of lines (spaces) are formed. To maintain the desired periodicity, the total number of beam steps in one line and in one space, multiplied by the step-size (so called pixel), must be equal to the grating's pitch. A grating of an equal line-space design then, by definition, is generated by moving an unblanked beam over the line (for a negative resist material) and by moving a blanked beam over the gap with the same number of steps, each equal to half of that required to generate a designed pitch.

Since the incident electron beam and the previously mentioned long- and short-range scattering are of symmetrical and statistically random nature, it is customary to describe them by a gaussian function: $\exp(-X^2/\beta^2)$ where $\beta$ parametrically represents the spread of the beam or the spread of a given type of scattering. Since it is known that the spread of a beam in a E-beam writer is smaller or about the same as the spread of forward scattering, but significantly smaller than the spread of back-scattering, it is convenient and appropriate to introduce an effective forward scattering equal to $(\beta 2_F + \beta 2_B) Pp$, [?]. This definition of the effective forward scattering implies that there are two ways to change its value experimentally, either to vary the width of the beam $\beta_B$ by defocusing the beam, or to vary the original values of forward scattering $\beta_F$ by changing the E-beam writer's accelerating voltage. It is assumed that an individual gaussian function that represents an effective forward scattering range can be assigned its own $\beta$, which affects the gaussian's own spread.

In this way, an equal line-space grating can be mathematically represented as a sequence of a certain number of gaussians per line and the absence of the same number of gaussians per space. A numerical summation of the gaussians constituting the grating then emulates the energy deposition function over the grating, including the areas near or at the edges of grating's lines and gaps.

The summation of the gaussians over the grating is considerably simplified by the analysis of energy deposition function in a very wide isolated line, i.e. a line composed of a very large number of gaussians such that the number of gaussians times pixel size is much larger than the back scattering spread. Essentially such a very wide line (VWL) is itself a grating of a pitch equal to pixel size. A numerical summation of gaussians which constitute a VWL provides the following result; as long as the ratio of $\beta$ to the pixel size is larger than 0.886, the energy deposition function in the mid-portion of a VWL has a constant flat amplitude and thus is invariant of $\beta$. Therefore, with the appropriate pixel size, both forward and back scattering contribution to energy deposition in the mid-portion of a VWL has its own, but constant, amplitude.

For the case of a grating, a numerical summation of back-scattering gaussians gives the same constant-amplitude contribution in the middle of the line and the middle of the gap, over the central portion of a grating, as long as the ratio of back-scattering $\beta$ to the grating's pitch is larger than 0.886. This finding indicates that an "effective forward scattering" is responsible for the non-flat amplitude of energy deposition curve over the space-line interface in a grating.

Figure 2:
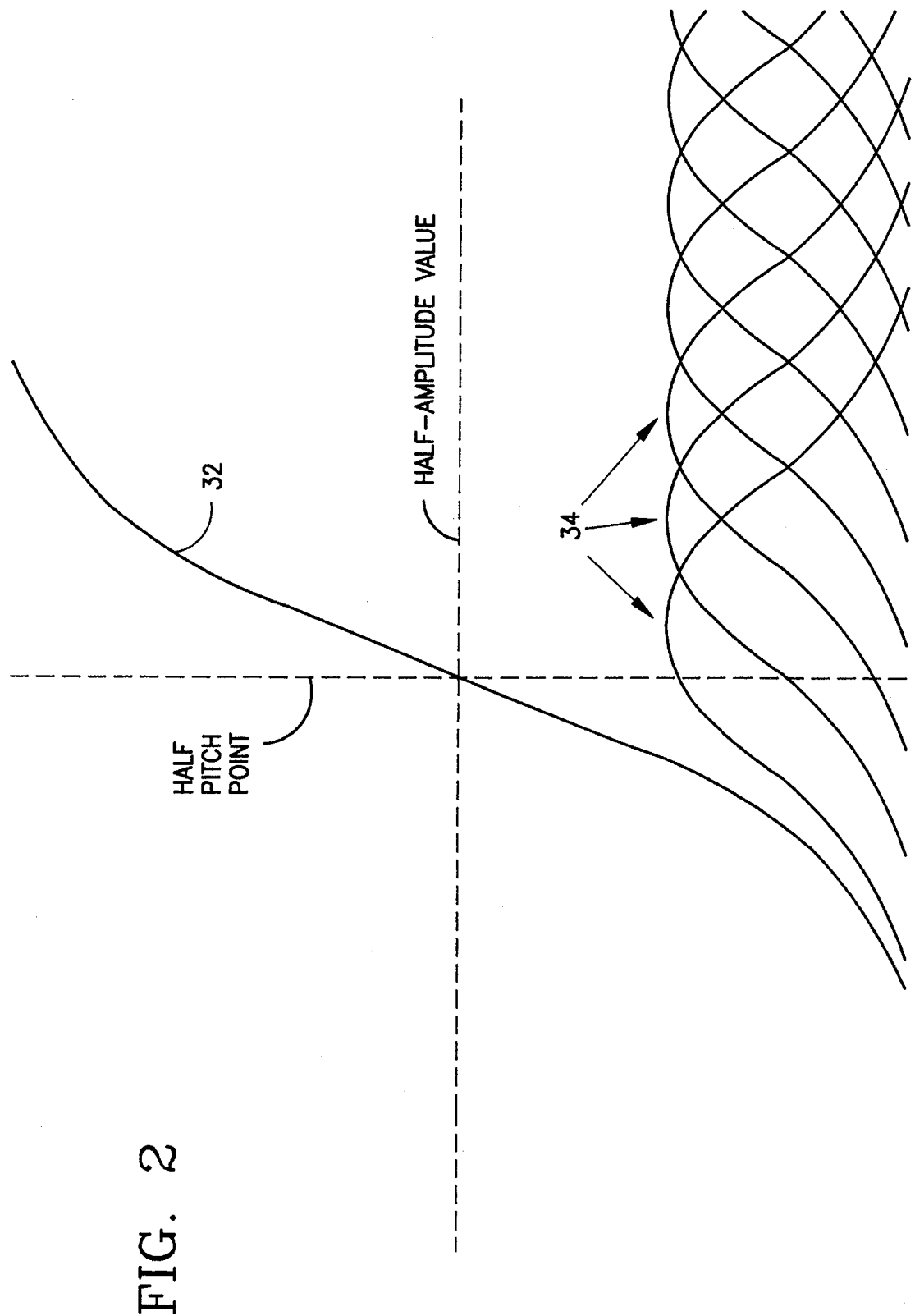
FIG. 2 is a graph of energy deposition at the edge of a line in a grating having a first scattering value.

The spatial shape of the energy deposition contour over the space-line boundary in a grating of 2 μm pitch is shown in FIG. 2 (the value of the pitch is selected only as an example). The contour 32 is a result of numerical summation of the individual forward scattering gaussians 34 with $\beta$ fixed at 0.050 μm. The separation between the gaussians, constituting the grating, is 0.025 μm. The dashed vertical line represents the half-pitch point of the grating, i.e. the desired edge placement; the dashed horizontal line represents the calculated half-amplitude value of the energy deposition in a mid-portion of a VWL (hereinafter HAVED-VWL), hypothetically exposed only with forward scattering gaussians of quoted parameters.

In accordance with symmetry considerations, discussed hereinafter, the calculated value of energy deposition in the grating reaches the HAVED-VWL value at a point that is exactly one-half the width of a pixel from the center of the first gaussian forming a line. To the left of this point, in the space area, the energy deposition decreases relative to HAVED-VWL; to the right of the half-pitch point, in the line area, the value of energy deposition increases as compared to HAVED-VWL. Due to symmetry, the same effects occur at the other side of the grating's line, not shown in FIG. 2. Thus, the HAVED-VWL also occurs on the right hand side of the line at a point that is one-half of the pixel distant from the center of the last gaussian forming the line. Those two points, on the left and right-hand side of the line, are the half-pitch points, since their separation equals the half-periodicity of the grating, by definition of the grating.

The width of the line, as determined via the edge positioning, therefore depends on a matching combination of two factors: the value of energy deposition inferred from the contour, and the developer's strength. For a negative resist material, the developer's strength is its ability to dissolve and remove those areas of the material where the energy deposition value does not exceed the developer's insolubility threshold, which is defined by the developer's concentration. The edge placement can therefore be traced, qualitatively at least, by applying the developer at various strengths. If a developer of a "nominal" strength is applied, i.e. the resist is dissolved up to the HAVED-VWL point, the edge is placed at the half-pitch point and the width of a central line is equal to the width of the space. A developer of a strength below the nominal one consequently places the edge in the "space" area with the result that the width of the line is larger than the width of the space. Inversely, a developer of a strength above the nominal one makes the width of the line smaller than that of the space.

Figure 3:
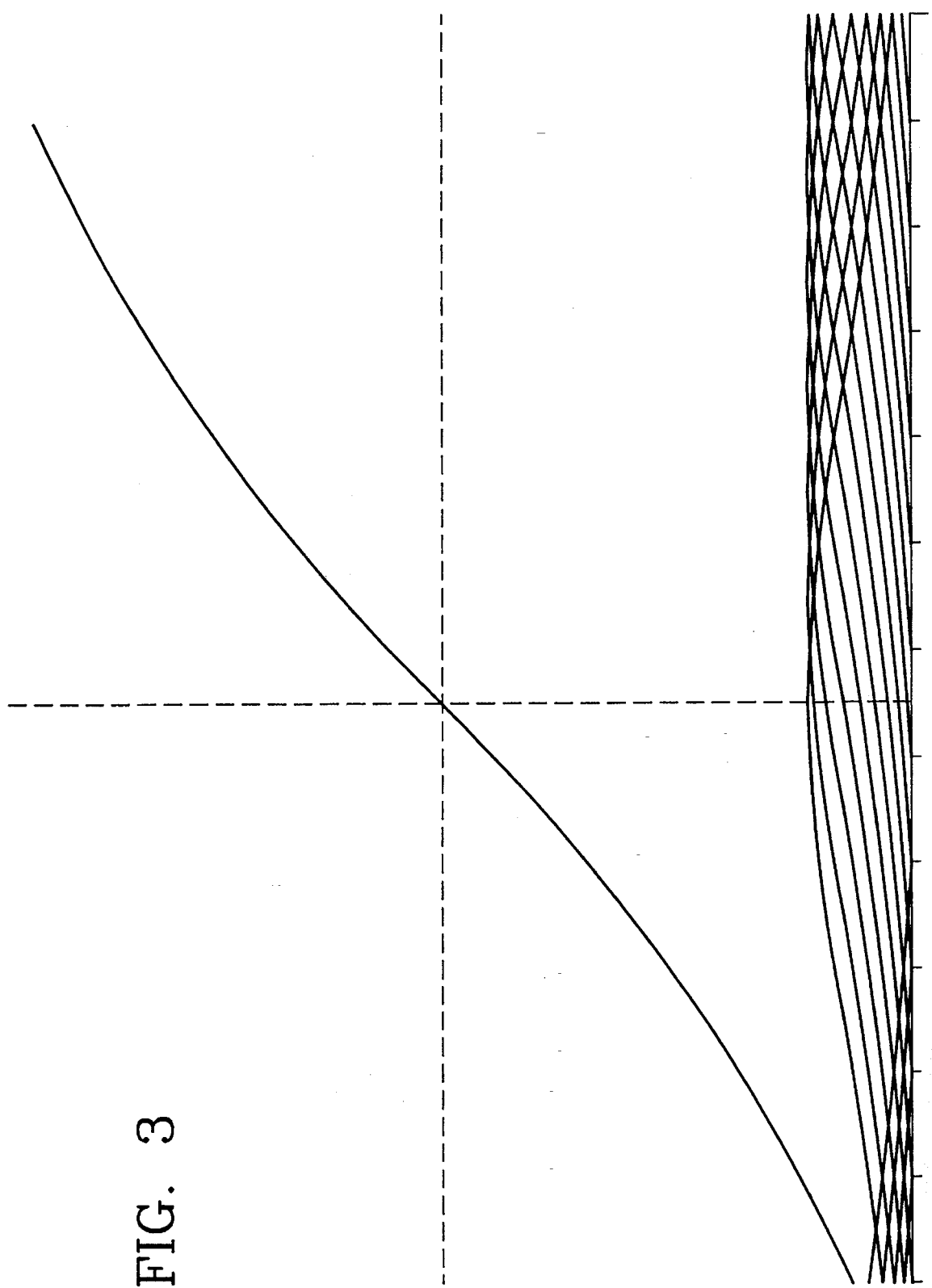
FIG. 3 is a graph of energy deposition at the edge of a line in a grating having a second scattering value.

FIG. 3 illustrates the shape of the energy deposition contour calculated again, for a 2 μm pitch grating, via summation of the gaussians separated by the same distance as in the previous case, but with an effective forward scattering $\beta=0.125$ μm. To emulate real exposure, which is done at constant beam current, the amplitude of an individual gaussian in this case is adjusted so that the area under the gaussian with $\beta=0.125$ μm is equal to that for the gaussian with $\beta=0.050$ μm. A direct comparative examination of the two calculated contours (FIG. 2 and FIG. 3) indicates that solely changing the effective-forward-scattering value in the identical gratings profoundly in the line and the space areas. It can be seen that, at equivalent locations in the space area, more energy is deposited in the large-$\beta$ grating than in the small-$\beta$ grating, but in the line area the relative difference between the two has been reversed. Mathematically speaking, the variation of the $\beta$-value has markedly modified the slope of the energy deposition contour over the space-line interface, in the identical-pitch gratings. In spite of the $\beta$-variation, however, there is a singular point of parity located exactly at the space-line interface, i.e. the half-pitch point, where the energy deposition value remains unchanged or, mathematically speaking, is invariant of the $\beta$-variation because the preservation of the energy deposition value, i.e. HAVED-VWL, at that point in each grating must be enforced by the symmetry-based requirement.

The symmetry consideration essentially proves that the point on the energy deposition contour that is equal to HAVED-VWL occurs exactly at the half pitch point for a grating of equal width lines and spaces. This concept is further discussed with reference to FIGS. 4a and 4b. FIGS. 4a and 4b represent two wide, equal line/space gratings in which each line of the grating is generated by a group of equally spaced gaussians 40. As shown in FIG. 4a, a pixel is the distance between adjacent gaussians.

A nominal point P is defined on the left side of one line, located half a pixel to the left of the leftmost gaussian of that line (FIG. 4a). A nominal point P' is defined on the right hand side of a line in the other grating (FIG. 4b), also half a pixel from the right hand gaussian of that line. If the second grating is superimposed on the first grating in such a way that P' coincides with P, the result is a continuous array of gaussians which constitute a very wide line (VWL). If the forward scattering ($\beta$) of the gaussians is greater than 0.886 pixel, the summation of these gaussians is constant across the line and equal to a value S. Since the two gratings are identical, when they are separated the summation value at P must equal the summation value at P' and must therefore equal S/2. In other words, HAVED-VWL occurs at the half-pitch point.

This concept also applies to gratings that are made up of symmetrical non-gaussians. If the non-gaussian is, at all points, wider than a gaussian whose $\beta$ is greater than 0.886 pixel, the wide line made from the superposition of the gratings will again have a flat top with a summation value Sn. In the individual gratings the values at P and P' must both be Sn/2.

By virtue of the development process described previously, the relative edge-placement in each grating can be deduced. Since the slope of the energy deposition contour in the smaller-$\beta$ grating is steeper than that in the larger-$\beta$ grating, the edges of a line in the smaller-$\beta$ grating are positioned closer to the half-pitch point than the edges in the larger-$\beta$ grating, as long as the identical, but not nominal, strength developer is applied. This means that, except for the nominal developer, within the same range of developing strengths, the magnitude of the actual edge-placement's deviation from the desired one (namely the half-pitch point), the so-called magnitude of edgewidth variation, must be a function of $\beta$ in the identical-pitch gratings. This fact leads, in turn, to a conclusion that the magnitude of the actual linewidth's deviation from the designed value, finalized by these developers in identical-pitch gratings as a function of the developer's strength, must be parametrically affected by the choice of $\beta$-value. For this reason it follows that the curve—the central line's actual width versus the developer's strength—is a slower-varying function of the developer strength for a smaller-$\beta$ grating than the analogous curve for a larger-$\beta$ grating, as long as the same set of developers is applied. If the set includes the nominal developer, the two curves must have the singular common point of parity, a cross-over point, where the linewidth in each grating must not deviate from the designed value because the edge placement, by the symmetry requirement, is enforced at the desired location, that being the half-pitch point.

Mathematically speaking, this theory identifies the $\beta$-invariant condition which is exclusively imposed at the half-pitch point, and which is expressed in terms of equal linewidth rather than equal energy deposition. This identification, in essence, establishes the dimension-verifying criterion to be used in the fabrication of a standard since the criterion provides a practical validation of the end product by means of a relative, rather than an absolute, linewidth measurement that detects the cross-over point.

In practice, in order to accurately detect the cross-over point of two curves, it is necessary to generate a large enough slope differential between them. Since, in theory, the slope differential is defined by the difference between αs that are used, a two-to-threefold difference in short-range $\beta$ should be sufficient for accurate experimental determination of the cross-over point (see FIGS. 2 and 3).

These considerations remain valid for a practical situation, where the developer strength is kept constant, but the incident dose at constant current is varied above and below a nominal dose, i.e. the dose required to reach HAVED-VWL at the half-pitch point in a grating. Dose is best varied by maintaining the electron-beam current constant while varying the dwell time, which is the time during which the electron beam exposes the resist material. Variation of the incident dose has an analogous, but inverse effect, to the variation of the developer's strength. Thus, if the developer's strength is kept constant but the incident dose is increased above the nominal dose, the energy deposition at the half-pitch point is greater than the developer's insolubility threshold, and this threshold occurs at a point on the energy deposition curve below the half-pitch point. For a negative resist material, the developed linewidth is then greater than the half-pitch value. Similarly, if the incident dose is decreased below the nominal point, the developed linewidth is less than the half-pitch value. The effect of β remains the same in that the magnitude of the deviation from the designed value depends directly on β.

The fabrication of different gratings with energy deposition curves having different respective slopes over the line-space interface can theoretically be achieved by varying β from one grating pattern to the next. As discussed previously, this variation can be achieved by defocusing the electron beam and/or by varying the accelerating voltage of the E-beam writer. Both of these techniques have certain experimental difficulties associated with them, however. Therefore, it is preferable to employ a different approach to varying the slope of energy deposition over the line-space interface that does not require β to be changed.

Figure 5A:
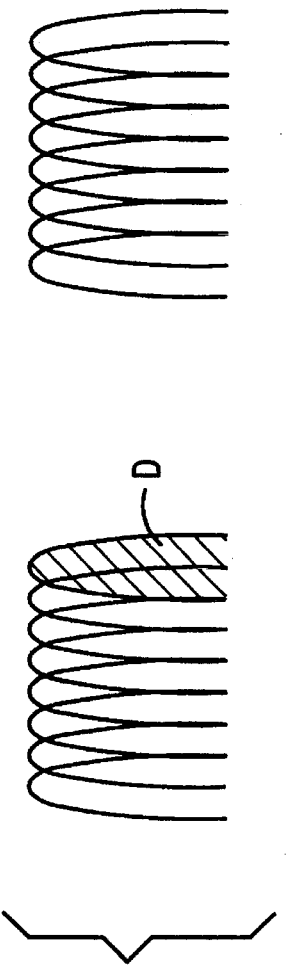
FIGS. 5a–5c are illustrations of energy gaussians for a normal, triple-unshifted and triple-shifted grating, respectively.
Figure 5B:
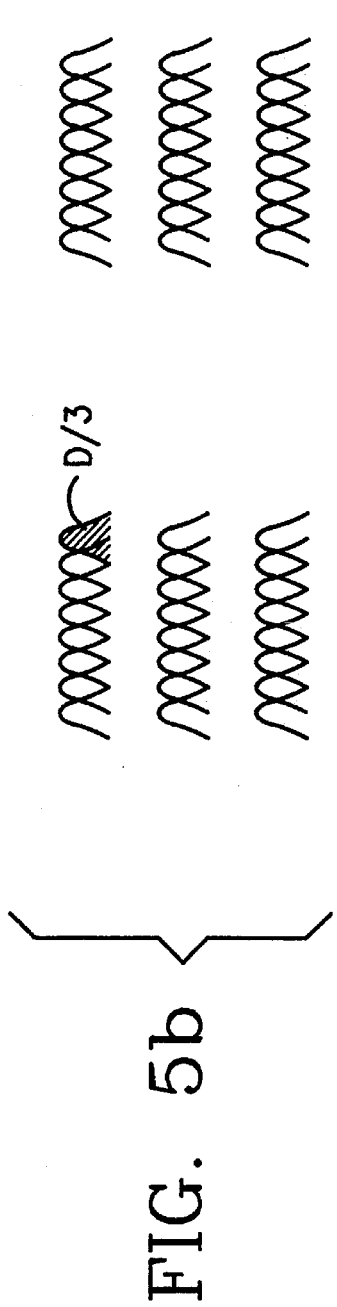

In accordance with the present invention, the energy deposition contour over the interface of a line and a space can be varied at a fixed β by means of multiple shifted and unshifted gratings. The formation of these types of gratings is explained with reference to FIGS. 5a–5c. FIG. 5a illustrates the exposure pattern for an equal line-space grating. The gaussians represent an exposed region of the pattern that is stepped over once by the electron beam with an incident dose D. A grating that is formed in this manner is termed a "normal" grating. A grating that is identical to such a normal grating can be formed if the pattern of FIG. 5a is exposed by stepping the beam across the material a multiple number of times, e.g. n times, at an incident dose D/n for each exposure. A grating formed in this manner is termed a "multiple unshifted" grating. Alternatively, the multiple unshifted grating can be generated by exposing a complex grating pattern, which comprises a superposition of n subgrating patterns, as illustrated in FIG. 5b for the case of a triple unshifted grating. In the formation of this grating, the three subgrating patterns are aligned with one another, and each subgrating pattern is exposed one time with an incident dose D/3.

Figure 5C:
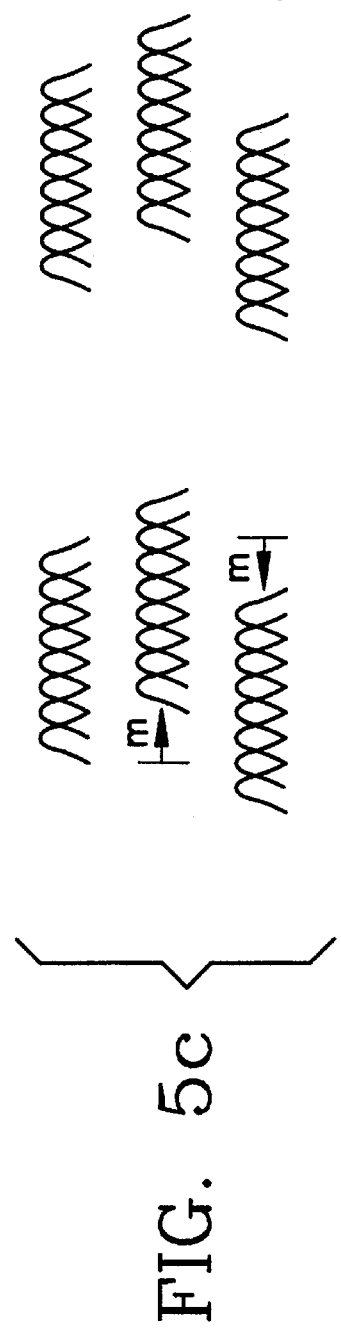

FIG. 5c illustrates the arrangement of the subgrating patterns for a triple shifted grating. As with the grating of FIG. 5b, the grating comprises three subgrating patterns, and each subgrating pattern is exposed one time with an incident dose of D/3. In this arrangement, however, the locations of the subgrating patterns are shifted relative to one another. In the specific example of FIG. 5c, one of the subgrating patterns is aligned with the "normal" grating of FIG. 5a, another subgrating pattern is shifted to the right by a distance equal to two pixels, and the third subgrating pattern is shifted to the left by a distance equal to two pixels. The appropriate numerical summations of the fixed-β gaussians, constituting the multiple shifted grating, confirm that by varying the shift value, the energy deposition contour can be modified in the same manner as a variation in β would achieve.

It should be noted that the value of three for the number of subgrating patterns in a multiple shifted or unshifted grating, and the value of two pixels for the distance of the shift, are merely exemplary. Any suitable number, n, can be chosen for the number of subgrating patterns. Preferably, n is an odd number to provide symmetry of the shifted subgrating patterns relative a centrally located subgrating pattern. Similarly, any suitable value can be chosen for the distance of the shift. In this regard, the value of the shift need not be equal to an integer number of pixels.

The symmetry considerations that postulated the attainment of HAVED-VWL at the nominal point in two normal gratings with different forward-scattering βs are applicable in the case utilizing normal and multiple-shifted gratings, as well as in the case utilizing multiple-unshifted and multiple-shifted gratings. The case for multiple-shifted gratings is illustrated in FIGS. 4c and 4d. These two figures respectively depict the gaussians for two identical triple-shifted gratings. If the two gratings are super-imposed upon one another such that the two half-pixel points P and P' coincide, a flat top summation value Ss is achieved. When the two shifted gratings are separated, the values of the points P and P' must be at the half-amplitude value of this summation value. In other words, the same symmetry requirements are imposed on a triple-shifted grating as are present in normal and unshifted gratings.

Figure 6:
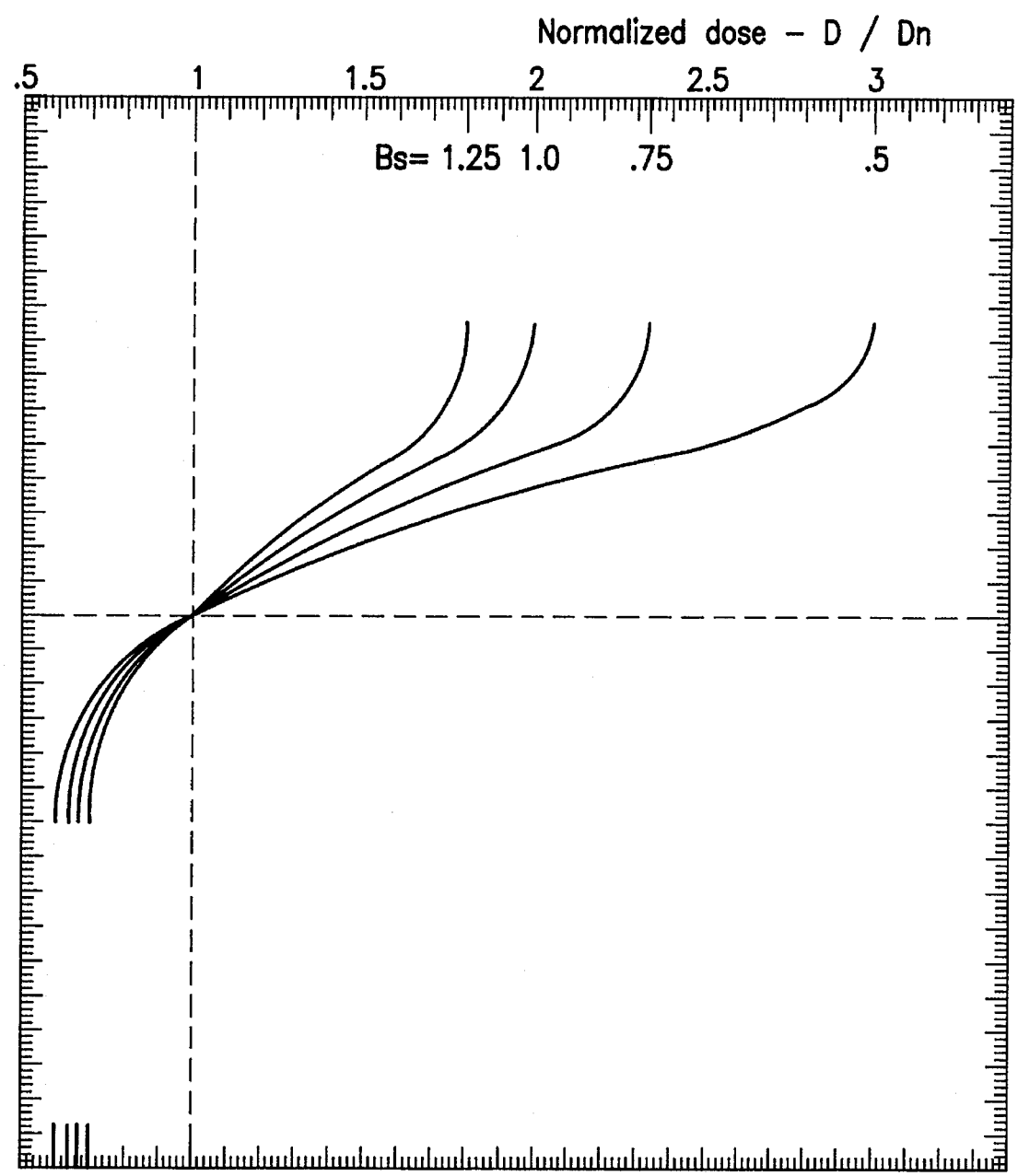
FIG. 6 is a graph of linewidth versus dose in a triple unshifted grating.
Figure 7:
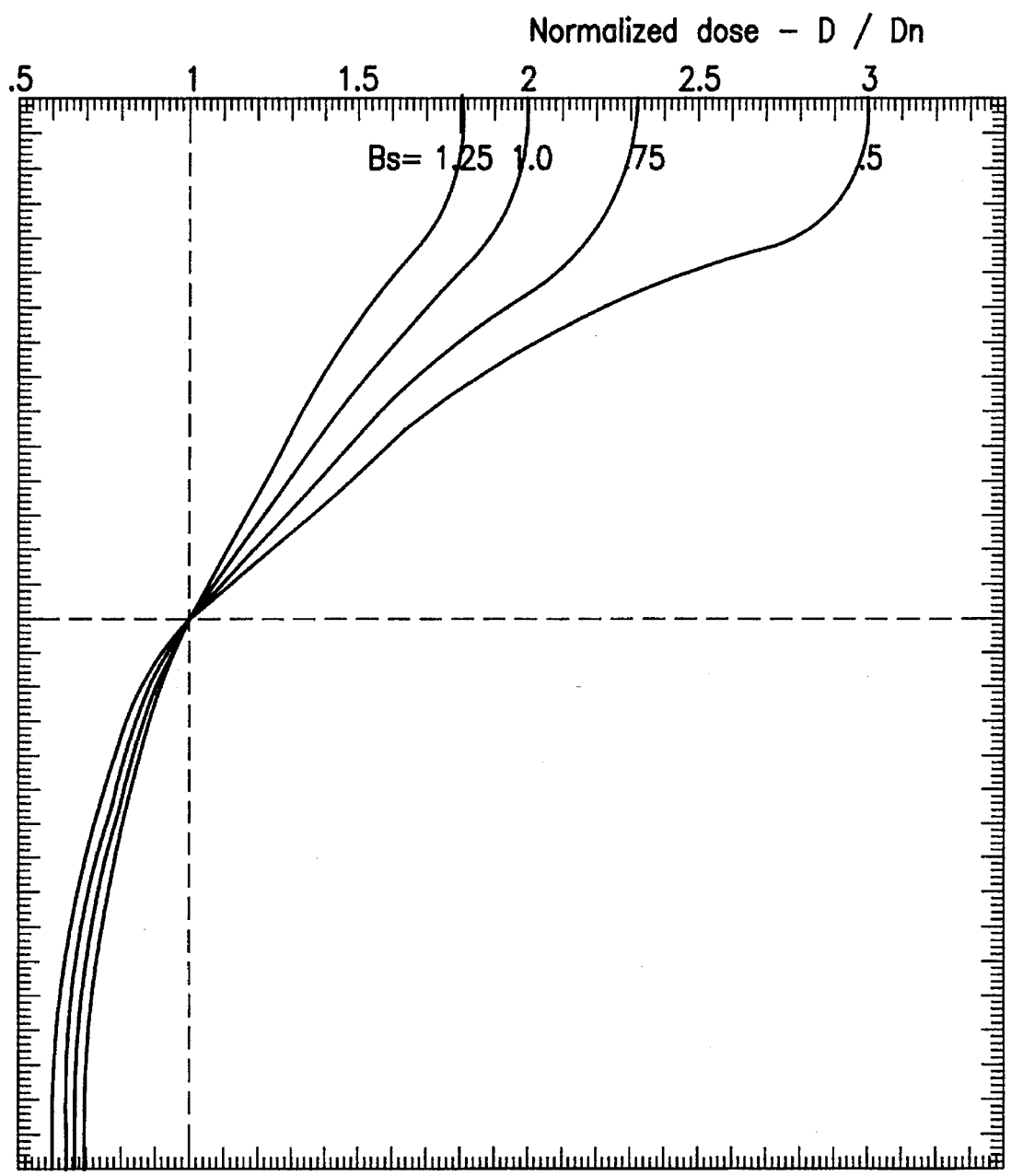
FIG. 7 is a graph of linewidth versus dose in a triple shifted grating.

Numerical summation of the forward-scattering gaussians, which constitute the multiple unshifted and multiple shifted gratings, predicts an experimentally observable difference of the linewidth's slope as a function of incident dose. This can be seen in the graphs of FIGS. 6 and 7. FIG. 6 depicts linewidth versus dose for a triple-unshifted line at different ratios of back-scattering to forward scattering, and FIG. 7 depicts linewidth versus dose for a triple-shifted line at the same ratio values. Almost a 3:1 ratio of the slope of the linewidth variation between the triple-shifted grating and triple-unshifted grating is predicted by calculation when the grating's shift is about 1.5β, and the pixel size is about 0.5β.

Since these conditions do not introduce unwanted complications, experimental verification of the theoretically predicted occurrence of the crossover were undertaken. These experiments investigated the practicality of sub-micron and sub-half-micron standard fabrications, and constitute a reduction to the practice of these standards.

Experimental Example

The following examples demonstrate that the theory's predicted cross-over effect can be unambiguously observed and subsequently utilized for practical fabrication of a standard for determining the systematic error of a measuring device. Following the logic of the theory, the lithographic phase necessary to fabricate triple-unshifted and triple-shifted gratings of equal, but variable, pitch at a range of doses, including a nominal one, will be described first. Then, the metrological phase, i.e. the methodology developed for SEM-based relative linewidth measurements, necessary to identify the cross-over point in an accurate fashion, will be elaborated upon. The data is analyzed with the assistance of the theoretical criterion that the nominal dose is, by symmetry, invariant with respect to the grating's pitch and shift.

A. Lithographic phase

The lithographic phase of this example involves the following steps: a) the pattern design for the triple-unshifted and triple-shifted equal line-space gratings; b) the pre-and post-exposure treatment of the resist, including the development and c) the actual E-beam exposures of all designed patterns.

As a first step, patterns of 1 μm and 2 μm equal-line-space gratings in normal, triple-unshifted and triple-shifted configurations were designed for an E-beam writer, for subsequent exposure of a resist material on a wafer. Four shifted patterns, having shifts of 0.100 µm, 0.140 µm, 0.200 µm and 0.250 µm respectively, were prepared for each of the 2 µm and 4 µm pitch gratings. Every pattern's width, i.e. the distance between the first and the last line in a grating, was much greater than the electron back-scattering distance. Similarly, the length of a line in a grating was also much greater than the back-scattering distance. In this particular example, the width of each pattern, as well as the length of each line, was 100 µm. In this way a considerable-sized area within each grating's central portion was created, where several lines, due to the nature of electron scattering in the gratings, have the same width at a given dose. This approach significantly simplifies the practical logistics of the measurements.

This variety of pitches and shift-values is sufficient to evaluate the accuracy of the cross-over point determination by means of the nominal dose and systematic error-invariancy criteria.

Next, a widely used high-contrast negative resist (SAL 603 by Shipley) was spin-coated on a silicon wafer, so that close to 0.5 µm resist thickness was attained. The pre- and post-exposure resist treatment was done at the temperature recommended in scientific literature and by the manufacturer, to achieve the most enhanced high-contrast performance. The development was done by immersing the wafer in the developer solution MF-312 of 0.54 normality strength.

Figure 8:
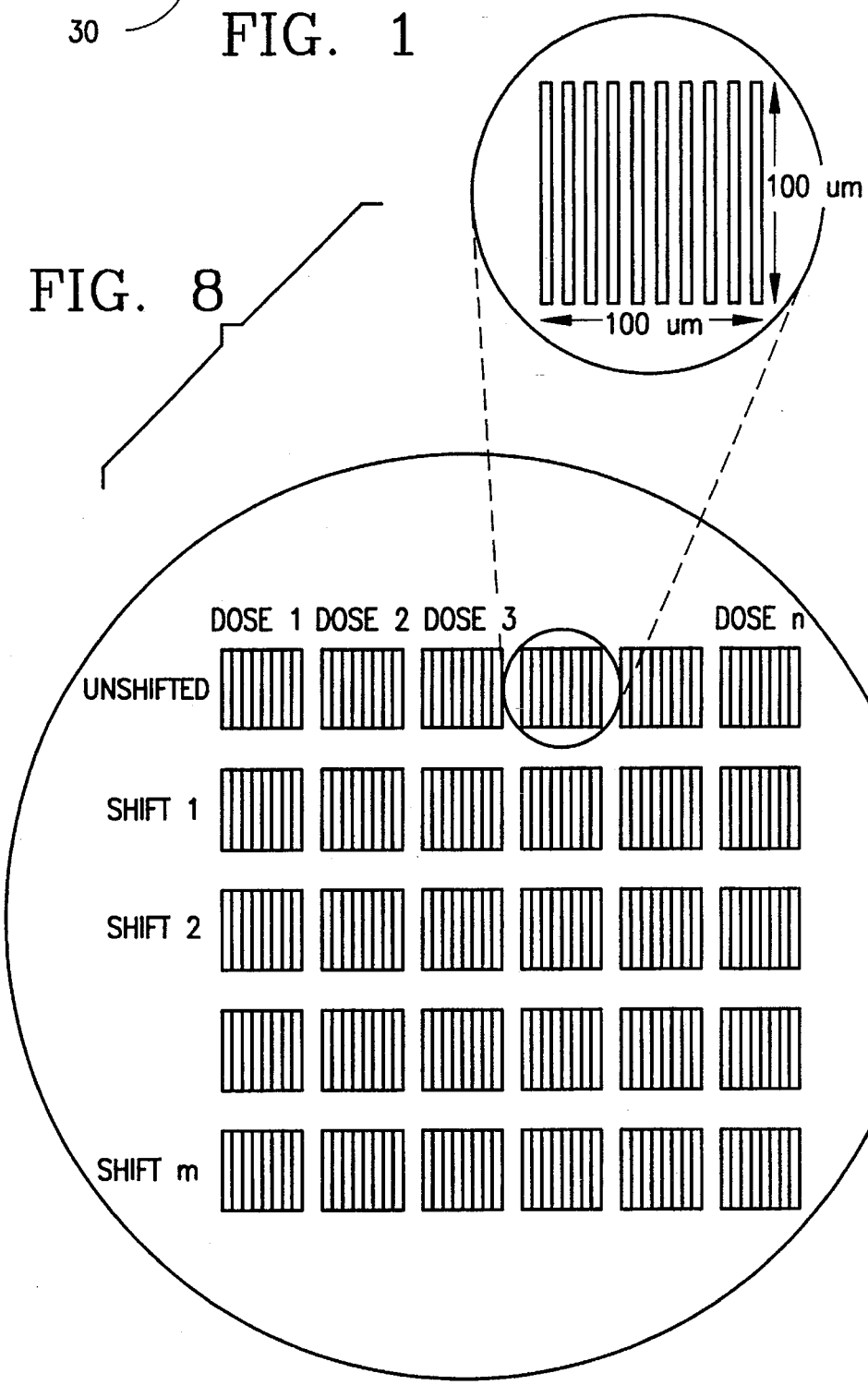
FIG. 8 is an illustration of an array of grating patterns on a wafer.

E-beam exposure of the wafer, in accordance with the designed patterns, was carried out with a commercial E-beam writer (EBMF-150 by Cambridge) operated at 40kV accelerating voltage. A 0.050 µm pixel size was used and the exposure was such that each grating was written at the center of its own exposure field. At these conditions the effect of the beam placement distortions on the physical linewidth in the central portion of the grating was negligible, according to the equipment specification. At the beam's spot size of approximately 0.050 µm, the beam current's variation was kept within 2% of a pre-established value during the course of the exposures. For the convenience of the SEM-based linewidth measurements, all identical patterns were arranged on the wafer along respective rows so that each identical pattern to the right of its neighbor was given an equi-incremental dose relative to the dose given to that neighbor. All non-identical patterns, by pitch or by shift, were arranged along the columns. The resulting array of grating patterns is illustrated in FIG. 8. In each of the multiple shifted and unshifted gratings, each of the three sub-gratings that belong to the pattern located on the same column was given ⅓ of the dose given to the normal grating located on the same column, independently of the shift value.

For the instrumental settings quoted, the starting incident dose given to a "normal" grating was 1.75 µC/cm². In 0.25 µC/cm² increments, the incident dose was raised to 7 µC/cm², B. Metrological Phase Measurements of linewidth were performed near the center of each grating. The equipment used was an SEM by BIO-RAD, model DL-3006. This microscope was equipped with a LaB₆ gun, a digital scan-generator, and a linewidth measurement software/hardware package. The peak-to-peak linewidth measuring algorithm was used. Every effort was made to keep the SEM calibration and other instrumental settings identical throughout the measurements. An SEM accelerating voltage of 5kV was used as a compromise between two competing requirements. More particularly, low voltages are desirable in order to reduce signal distortions. On the other hand, at low voltages with this equipment, the gun brightness is insufficient to achieve adequate reproducibility of the measurements.

Linewidth measured along each row on the wafer revealed the dependence of linewidth on incident dose for the identical patterns on that row. As described in the next section, comparison of the results for pairs of rows identifies the cross-over point where the theory requires that the physical linewidth equals the design value. In order to assure a correct determination of the cross-over point, the linewidth at each dose must be measured in the same relative terms to the actual linewidth. This implies that the random errors must be minimized and that systematic error inherent to the measurement process must be independent of the linewidth being measured.

Random errors are generated due to the statistically distributed instrumental instabilities characteristic for given instrumental settings and, as a rule, are independent of the feature's width being measured. Usually, it is possible to keep the magnitudes of the random errors sufficiently small by establishing and maintaining the most favorable operating conditions and by increasing the number of measurements per data point.

The systematic error of SEM-based measurements is generated due to distortions inherent in the image formation mechanism caused by electron scattering. In the case of resist imaging, charging of the specimen generates its own contribution to the systematic error. Unlike random error, both could be feature-width dependent unless the appropriate imaging conditions are implemented.

At 5kV imaging it was experimentally determined that the effective back-scattering electron range in the resist was about 0.65 µm. When the electron scattering range is less than the linewidth's value, the magnitude of electron scattering distortion, which affects the position of the signal's maximum relative to the edge position, is independent of the linewidth being measured. Therefore, the systematic error associated with the peak-to-peak measuring algorithm will also be independent of the physical linewidth. This is clearly true for the 4 µm pitch grating. In the case of the 2 µm pitch grating, some small dependency of the systematic error on linewidth, formed at doses far below the nominal dose, might be expected. For all other doses the measured linewidths are larger than the electron-scattering range at 5kV, as the data in the next section demonstrates. Thus, the systematic error in these measurements should be independent of the physical variation of the linewidth centered around a 1 µm value.

A traditional charge-preventing technique, the evaporation of a thin (about 0.005 µm) gold coating over the sample, was utilized. At subsequent imaging of the resist-made gratings at 5kV, it was found that, independently of the resist's linewidth, the shape of the video-signal associated with the resist's line image remained stable over time. It was also found that the silicon imaging signal inside and outside the grating remained at the same level. These observations laid the foundation for the conclusion that the resist-charging-contribution to the systematic error was constant, if not eliminated.

C. Results and Discussion

All results discussed below were recorded within the framework of the metrological requirements set up previously. The initial experimental data (FIGS. 9 and 10) was collected with the specific aim of verifying qualitatively the theoretically predicted cross-over effect. Each data point in both figures is the mean value of 64 measurements made for a given incident dose at one location per grating's line. The standard deviation (1σ) of the mean value was typically about 0.015 μm. The two curves in FIG. 9 respectively depict the data collected for the unshifted and the 0.200 μm-shifted triple gratings of 2 μm pitch. The data points displaced from the non-shift curve are those for the normal grating of the same pitch. FIG. 10 shows the data collected for the unshifted and the 0.250 μm-shifted triple gratings of 4 μm pitch. In both figures the linewidth measured in a grating is plotted along the vertical axis, while the value of the incident dose given to a normal grating, or equivalently the tripled dose value given to each sub-grating in all triple-gratings, is plotted along the horizontal axis.

Following the theory, ideally, the widths generated in the normal and triple-unshifted gratings should be identical. Although the linewidths are not identical, inspection of the data (FIG. 9) indicates that there is no gross error in the lithographic and metrological procedures employed, since the measured linewidth deviation in these gratings at every given dose does not exceed 3σ values.

Figure 9:
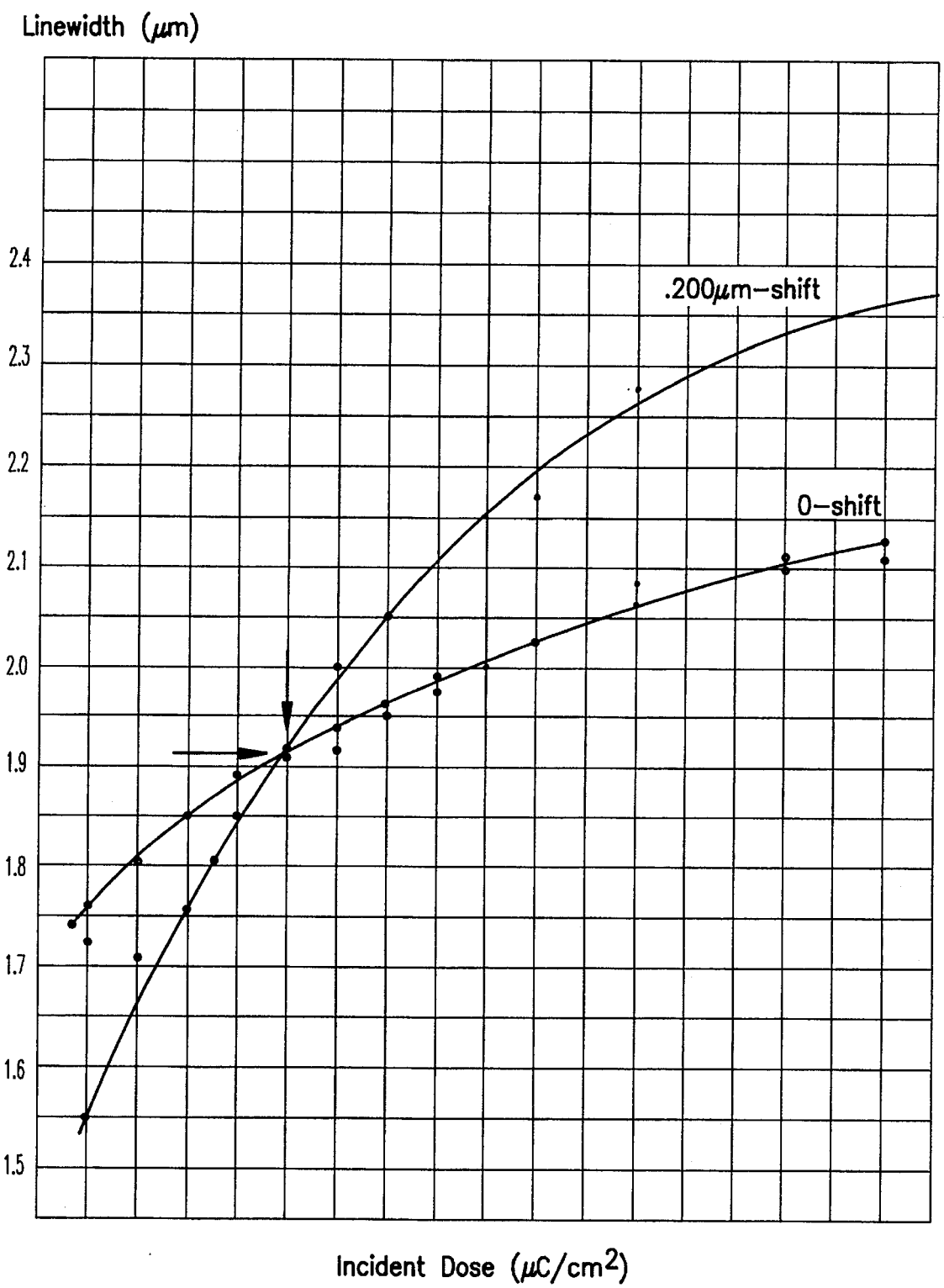
FIG. 9 is a graph of measured line width versus incident energy dose for a grating having a pitch of 2 μm.
Figure 10:
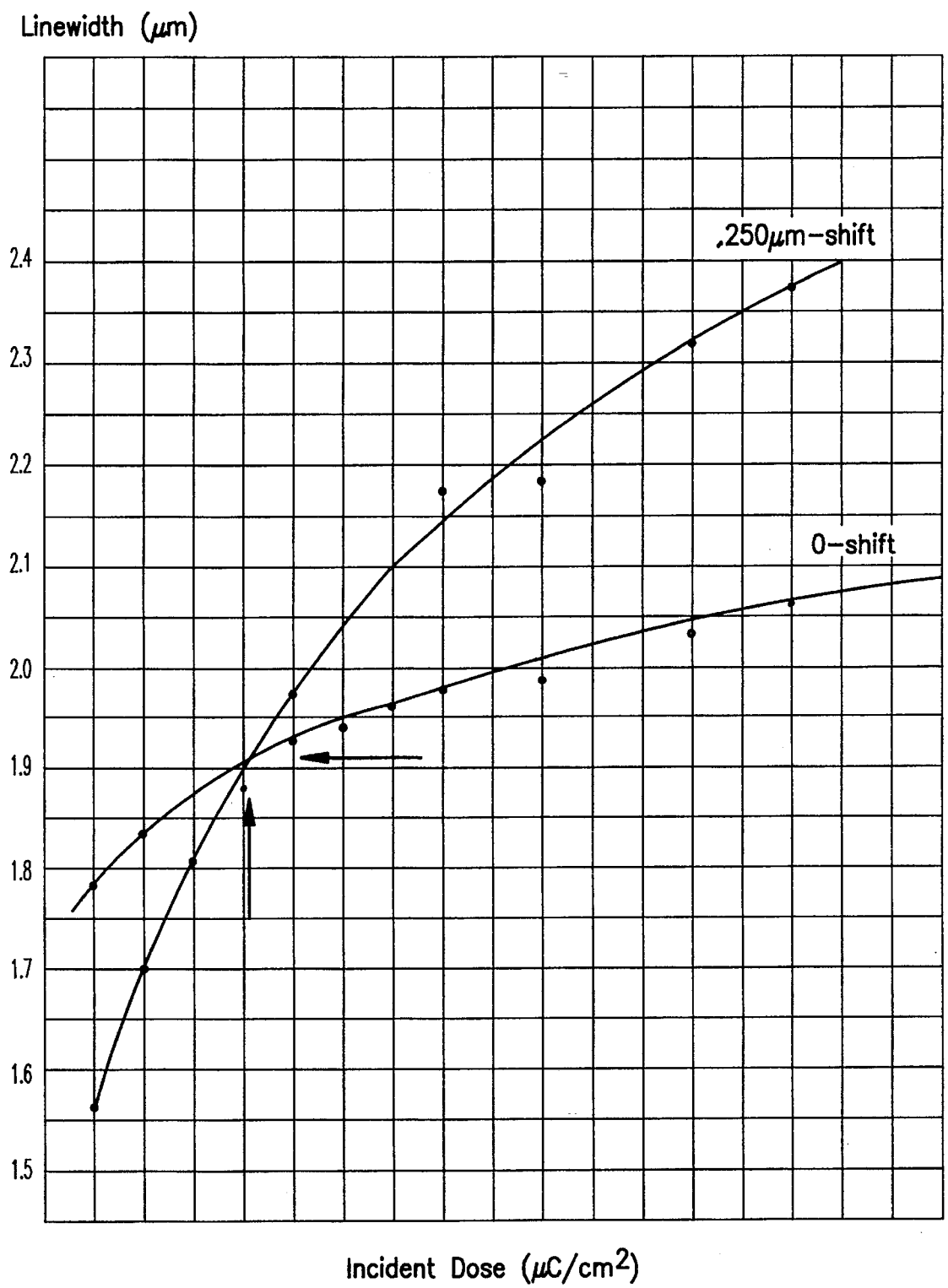
FIG. 10 is a graph of measured line width versus incident energy dose for a grating having a pitch of 4 μm.

FIGS. 9 and 10 provide the experimental evidence that dependence of the measured linewidth on incident dose is a function of the shift, as predicted by the theory. The cross-over point, defined in each figure as the point at which the measured linewidths for the shifted- and unshifted-gratings are equal, identifies the dose at which the physical linewidth equals the designed value. This identified dose is nearly identical in the two figures (3.2 μC/cm² versus 3.30 μC/cm²). Since the dose error of 0.05 μC/cm², is equivalent to about 2%, and since this error translates to less than 0.010 μm error in the apparent linewidth equality, it can be argued that an "experimental" incident dose of 3.25 μC/cm² is nearly invariant of the gratings' pitch and shift value. For this reason, it can be concluded that this dose, within the stated error, is a near approximation to the true nominal dose.

To explain further, the systematic error, which is defined as the deviation between the measured linewidth and the physical linewidth, equals the deviation between the measured linewidth at the cross-over point and the designed value. The same systematic error of 0.090 μm is deduced from FIG. 9 and FIG. 10. Consistently with the theory, this near-invariant systematic error cannot be attained unless the physical linewidths, generated at the nominal dose in non-identically shifted gratings of non-identical pitch, are nearly identical to the designed value, and unless the metrological requirements necessary for the correct determination of the cross-over point have been satisfied. Thus, it is reasonable to assert that, at the experimental incident dose of 3.25 μC/cm², the 1 μm and 2 μm resist-based dimensional standards have been fabricated and appropriately certified.

The determination of the nominal dose might be carried out in an iterative manner. As a first step in the iteration, a wafer can be prepared in the foregoing manner with a relatively large incremental variation between doses, and the two or more actual dose values on either side of the nominal dose can be determined. A second wafer can then be prepared with a much finer incremental dose change, within the range defined by the doses identified in the first step. This procedure can be repeated as necessary, with successively finer dose resolutions, until the nominal dose is determined with the desired degree of accuracy.

Once the nominal dose and systematic error have been established, the standard for a given absolute value has been identified. In the example given above, a line or a space in the center of the unshifted grating that was formed at the nominal dose of 3.25 μC/cm² constitutes the standard. This particular grating can be cut from the wafer and mounted on a separate substrate, or otherwise identified as the grating which contains the standard. This known standard can then be used to determine the systematic error for various types of measuring equipment.

To evaluate the accuracy of the artifact produced according to the foregoing example, an investigation was undertaken of the potential effects that the edge-roughness and the SEM's instability may have on the cross-over determination. To address these issues, a better statistical data collection procedure was implemented, as compared to the initial data collection represented in FIGS. 9 and 10.

The standard deviation (1σ) of the mean linewidth value was reduced to 0.005 μm by making 128 measurements at each location. The number of locations measured was increased to 3–8 per line. The edge roughness was found to be about 0.015 μm (1σ) by measuring the linewidth in the triple-unshifted grating over 30 locations. The actual edge-roughness is probably lower than this value, since it was found that long-term SEM instability introduces its own contribution to this value, and since it was found that the measured edge roughness is reduced by about 50% if the measurement time is reduced.

The linewidth data collected for the gratings exposed at 3.25 μC/cm² are listed in the table below. Complementary to the measured linewidth values, the values of the systematic error are shown in parentheses. All data listed in each line of the table was obtained during separate sessions, in order to average out the edge-roughness and the SEM's instability.

| PITCH | SHIFT | | | |
|---|---|---|---|---|
|  | 0 μm | .100 μm | .140 μm | .250 μm |
| 4 μm pitch | 1.927 (.073) |  | 1.925 (.075) |  |
|  | 1.922 (.078) |  | 1.921 (.078) | 1.930 (.070) |
| 2 μm pitch | .916 (.084) | .922 (.078) | .918 (.082) | .930 (.070) |

Each linewidth value is an average of mean values representing 3 to 8 locations per line. The mean value of systematic errors listed in the table is found to be 0.076 μm with 0.005 μm (1σ) standard deviation. The less than 10% non-invariancy of the systematic error again indicates that the 3.25 μC/cm² should approximate the true nominal dose.

Figure 11:
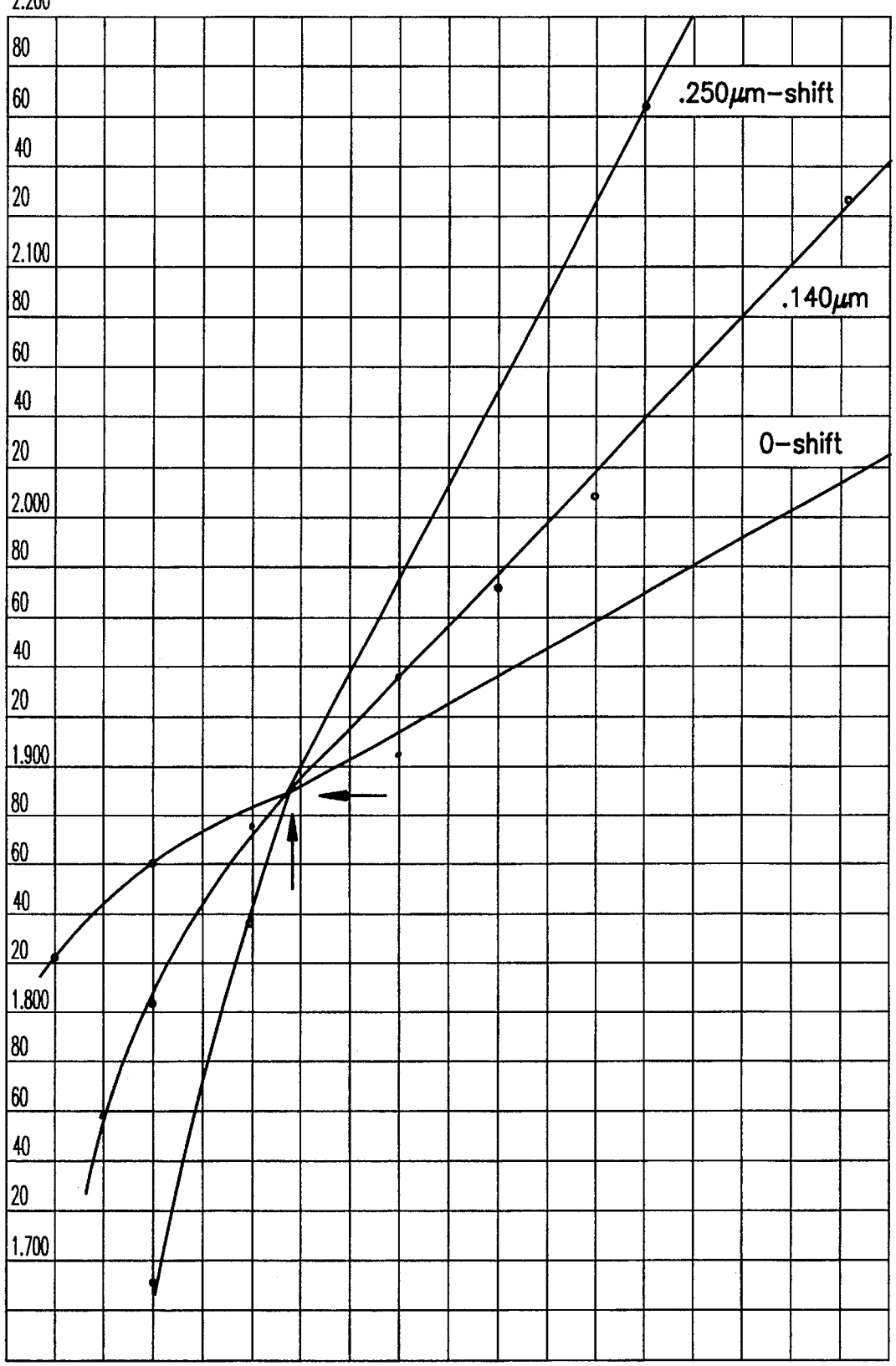
FIG. 11 is another graph of measured line width versus incident energy dose for a grating having a pitch of 4 μm.
Figure 12:
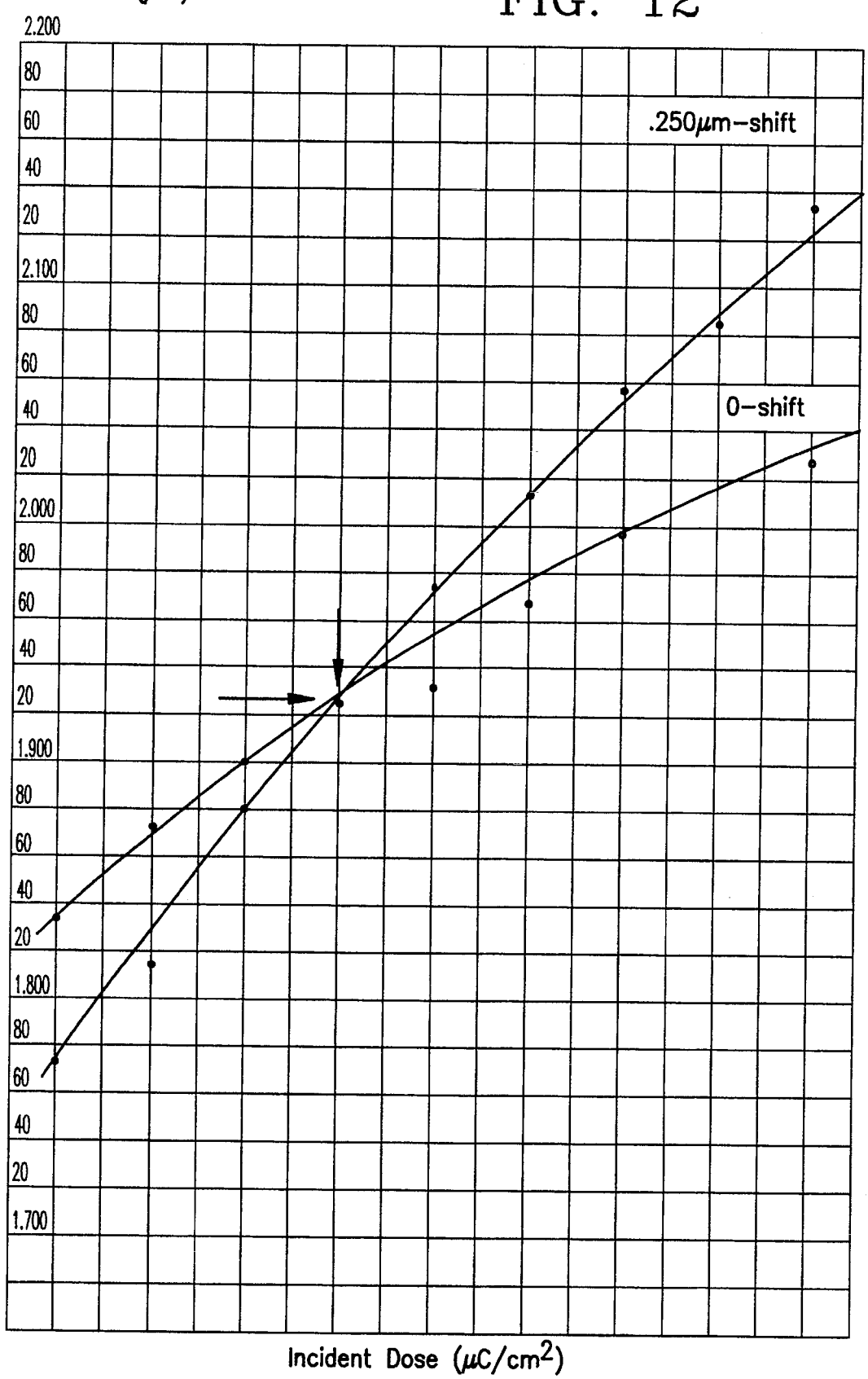
FIG. 12 is a third graph of measured line width versus incident energy dose for a grating having a pitch of 4 μm.

To test this assertion, the linewidth-versus-dose data was collected in the 4 μm-pitch triple gratings for the entire range of doses. FIG. 11 shows the data collected for zero, 0.140 μm and 0.250 μm shifted triple gratings, while FIG. 12 presents the data, collected at another session, for zero and 0.140 μm shifted triple gratings. Each data point in these figures is an average of the mean linewidth values representing 3 arbitrarily selected locations per line. It can be seen from the data in FIG. 11 and FIG. 12 that the cross-over associated dose values are 3.20 μC/cm² and 3.225 μC/cm², and the cross-over associated values of systematic error are 0.085 μm and 0.076 μm respectively. Comparing the values with the previously determined 3.25 μC/cm² dose and 0.076 μm average systematic error, it can be concluded that not worse that 0.010 μm (on average) approximation to the 1 μm and 2 μm absolute standard on resist has been provided.

The largest (and highly unlikely) deviation of the fabricated example from the absolute standard, as a result of the actual edge roughness, can be estimated in the following way. Assuming the 0.015 μm edge roughness and assuming a worst case that the triple unshifted grating was measured on the narrower parts of the line while the 0.140 μm -shifted grating was measured on the wider parts of the line, it was found that the cross-over in FIG. 10 moves by about 0.045 μm. This gives an error of about 0.2 μC/cm² in the cross-over associated nominal dose, which will be reflected in approximately 0.025 μm error in the width of the line in the unshifted grating and hence, about 0.025 μm error in the standard manufactured with this incorrect nominal dose.

A standard of better quality than 0.010 μm is certainly feasible to fabricate using this method, considering that the combined edge roughness and long-term SEM instability has been reported not to exceed 0.004 μm (1σ) when better lithographic and metrological equipment is employed to fabricate and to measure 0.200 μm equal-line space gratings.

At least about 2–3 months stability of the fabricated prototype can be expected, on the grounds that this period was the time span of the measurements presented here.

D. Extension to sub-micron and sub-half-micron dimensions

Resist-based normal gratings of pitch as small as 0.20 μm have been routinely produced, according to the prior art. In this sense, fabrication of multiple shifted gratings of the same pitch should not pose problems. The only issue relevant for the extension of the disclosed method to the fabrication of sub-micron and sub-half-micron resist-based standards is whether the shifted-gratings concept will work at these dimensions. For the half-micron equal-line-space gratings case, the 0.140 μm triple grating should be readily attainable, since enough room will be left in the 0.5 μm space. For dimensions smaller than that, there are two options presently envisioned. The first one is to use a commercially available E-beam writer which operates at higher than 40kV accelerating voltage. The use of such equipment will allow smaller spot size of the incident beam and smaller effective forward scattering range in the resist, than the values discussed above. This, in turn, most probably will allow the reduction of the shift-value in the multiple grating that needs to be introduced, in order to generate the measurable cross-over effect. The second option is to employ a combination of a multiple-unshifted grating of the desired sub- or sub-half-micron pitch and a multiple shifted grating of a 2 μm pitch. Following the foregoing theory, the symmetry imposed invariancy of the systematic error and the nominal dose at the half-pitch in these non-identical pitch gratings will be generated and detected by the cross-over point of the respective curves, reflecting the measured deviation of apparent linewidths from the designed value.

E. Extension to other materials

The foregoing method of fabricating a standard can be extended to any electroplatable metal by simple procedure modification. Among these metals, chromium and gold are particularly interesting, since these metals are presently used to fabricate optical and X-ray masks, respectively. Furthermore, they offer the potential for greater long-term stability of the standard, relative to one made from a resist material. The methodology of fabricating standards made with electroplatable metals involves only two additional steps. The first step is metal deposition on the Si wafer prior to resist coating, so that the electroplating base is formed. The procedures described previously with respect to a resist material is then carried out. The final, added step is an electroplating process that allows the metal to grow from the plating base in the space area of the grating. An equal line-space grating with metal lines, equal to a half-grating's pitch, results after removal of the resist in oxygen plasma.

The fabrication of standards based on poly-Si, $SiO_2$ and non-electroplatable metals could be done via etch transfer of certified dimensions of the resist standard. In this area an additional investigation is needed to determine the fidelity of the etch process. However, it is known that highly anisotropic horizontal-to-vertical etch rates in poly-Si and $SiO_2$ exist, so that the high-fidelity-to-resist-dimensions etch transfer is feasible.

F. Applications of the Technology

The applications of this technology would seem to be numerous, not only in microelectronics, but to many other areas. In the following discussion, only the applications directly relevant to the fabrication of high density ICs will be discussed.

A standard based on available electroplatable metal (Au, Cr, Ni or tanthallum) can be relatively easily integrated into a metrology-dedicated SEM. This will provide a unique ability to monitor the long- and short-term instability of the SEM, and hence to introduce appropriate corrections into the measurements relevant to the production cycle. A Cr- and Au-based standard will allow the quality of a mask to be used in optical and X-ray lithography, respectively, to be monitored.

A resist-based standard, or equivalently the knowledge of systematic error specific for the SEM linewidth measurement, will provide a unique possibility to monitor the quality of lithographic patterns by optical, E-beam and X-ray lithographic methods. Equally important, the parameters needed to set up the optical equipment for correct exposures at the wafer level will be available for the first time. Likewise, the parameters needed for correct E-beam exposures on a mask level (for optical and X-ray lithography) will be deduced from correct linewidth measurements of a specially designed pattern.

The use of a standard, based on resist or gold, will dramatically advance the metrological capabilities of newly emerging atomic force and tunneling microscopy, collectively called scanning probe microscopy. With such a standard it will be possible to calibrate presently available scanning probe equipment by factoring in the systematic error inherent in this method, due to unknown probe size and other sources. This properly calibrated scanning probe equipment, by the nature of the technique, will provide the near-absolute dimensional measurements (with the accuracy of better than 0.004 μm) on any material that is of importance to microelectronic fabrication lines. Thus, the combination of these standards and scanning probe techniques opens a new, much more efficient and cost-effective, way to monitor critical dimensions on any level of chip fabrication. Specifically, in addition to linewidth control, near-absolute overlay measurement, i.e. measurement of edge-to-edge distance for layered structures composed of different materials, can be performed for actual devices with the aid of a scanning probe microscope. Since the SEM-associated systematic error can be inferred from the scanning probe measurements on those materials (poly-Si, $SiO_2$, non-electroplatable metals) where the disclosed method is not straightforwardly applied, the creation of non-grating based standards, is also possible.

It will be appreciated by those of ordinary skill in the art that the present invention can be embodied in other specific forms without departing from the spirit or essential characteristics thereof. The presently disclosed embodiments are considered in all respects to be illustrative and not restrictive. The scope of the invention is indicated by the appended claims rather than the foregoing description, and all changes that come within the meaning and range of equivalence thereof are intended to be embraced therein.

What is claimed is:

1. A method for fabricating a dimensional standard for non-periodic dimensions, comprising the steps of:

(i) producing at least two gratings in a material where each grating comprises a plurality of lines having associated widths, and is formed by exposing the material to multiple subgrating patterns with an electron beam, wherein the locations of the subgrating patterns are shifted relative to one another, with the amount of said shift being different for said at least two gratings;

(ii) repeating step (i) at different respective incident doses of the electron beam;

(iii) measuring the width of a line in each of said gratings;

(iv) determining the incident dose at which the width of a line is the same for gratings having different respective amounts of shift; and (v) selecting an element of a grating formed with said determined incident dose as the standard for a dimension.

2. The method of claim 1 in which the amount of shift for one of said gratings is zero.

3. The method of claim 1 in which the number of subgrating patterns for a grating is an odd number.

4. A method for fabricating a dimensional standard for non-periodic dimensions, comprising the steps of:

producing a plurality of line-space gratings in a material where each grating is formed by exposing the material to an electron beam, and controlling said exposure such that some of said gratings have different respective incident doses of energy and each of said gratings has a different contour of energy deposited at an interface of a line and a space;

measuring a line width in each of said gratings;

determining the incident dose value at which the line width is the same for gratings having different respective deposited energy contours; and selecting an element of a grating formed with said determined dose value as the standard for a dimension.

5. The method of claim 4 wherein at least some of said gratings which differ from one another in their respective deposited energy contours are formed by exposing the material to multiple subgrating patterns, wherein the locations of the subgrating patterns are shifted relative to one another.

6. The method of claim 5 wherein the gratings which differ from one another in their respective deposited energy contours are grouped according to the amount of radiant energy to which the material is exposed, and wherein the exposure of each of the multiple subgrating patterns for the gratings in a group is carried out at an incident dose of D/n, where n is the total number of exposures used to form a grating and D is the total incident dose for the grating.

7. The method of claim 6 wherein one of the gratings in a group is formed by exposing the material to n subgrating patterns that are aligned with each other.

8. The method of claim 6 wherein said gratings are arranged on a substrate in the form of a two-dimensional array wherein the gratings in one dimension of the array have the same exposure pattern but differ in dose amounts, and the gratings in the other dimension of the array have the same dose amounts but differ in their respective exposure patterns.

9. The method of claim 6 in which n is an odd number.

10. The method of claim 4 wherein said gratings are formed by means of electron-beam lithography and said material is an electron-sensitive resist material.

11. The method of claim 10 further including the step of forming said gratings in an electroplatable metal.

12. The method of claim 11 wherein said metal is gold.

13. The method of claim 11 wherein said metal is chromium.

14. The method of claim 4 further including the step of determining the amount by which the measured width of a line deviates from said dimension in a grating formed with said determined dose, to thereby identify the magnitude of a systematic error for an instrument used to measure said dimension, relative to said material.

15. The method of claim 14 further including the step of calibrating an instrument used to measure said dimension, in accordance with said systematic error.

16. The method of claim 15 wherein said instrument is a scanning electron microscope.

17. The method of claim 15 wherein said instrument is a scanning probe microscope.

18. The method of claim 17 further including the step of measuring systematic error associated with a layered structure composed of different materials by means of a scanning probe microscope calibrated in accordance with said dimensional standard.

19. The method of claim 18 including the further step of measuring systematic error associated with said layered structure by means of a scanning electron microscope calibrated in accordance with said dimensional standard.

20. The method of claim 14 further including the step of monitoring the performance of said instrument by detecting changes in said systematic error over time.

21. The method of claim 4 wherein said dimension is less than a micron.

* * * * *